United States Patent
Takeyama et al.

(10) Patent No.: US 8,765,835 B2
(45) Date of Patent: Jul. 1, 2014

(54) EPDXY RESIN COMPOSITION HAVING MONOCYCLIC ALIPHATIC HYDROCARBON RING

(75) Inventors: Toshiaki Takeyama, Funabashi (JP); Yuki Endo, Funabashi (JP); Sayoko Yanagisawa, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 13/814,090

(22) PCT Filed: Jul. 27, 2011

(86) PCT No.: PCT/JP2011/067114
§ 371 (c)(1),
(2), (4) Date: Mar. 13, 2013

(87) PCT Pub. No.: WO2012/017896
PCT Pub. Date: Feb. 9, 2012

(65) Prior Publication Data
US 2013/0177849 A1   Jul. 11, 2013

(30) Foreign Application Priority Data
Aug. 5, 2010   (JP) .................................. 2010-176346

(51) Int. Cl.
  C08G 59/24   (2006.01)
  C08L 63/00   (2006.01)
  C07D 301/14  (2006.01)
  G03F 7/004   (2006.01)
(52) U.S. Cl.
  USPC ......... 522/170; 525/524; 523/455; 430/280.1
(58) Field of Classification Search
  None
  See application file for complete search history.

(56) References Cited

U.S. PATENT DOCUMENTS 3,565,922 A   2/1971   Rudy et al.
4,405,766 A * 9/1983   Bertram et al. ............... 525/507

FOREIGN PATENT DOCUMENTS

JP   A-2009-046565        3/2009
WO   WO-2012067071 A1 *  5/2012

OTHER PUBLICATIONS

Oct. 11, 2011 International Search Report issued in International Application No. PCT/JP2011/067114 (with translation).

* cited by examiner

*Primary Examiner* — Cynthia Hamilton
(74) *Attorney, Agent, or Firm* — Oliff PLC

(57) ABSTRACT

There is provided a curable composition having a low viscosity and high cationic curability. A curable composition including an epoxy compound of Formula (1):

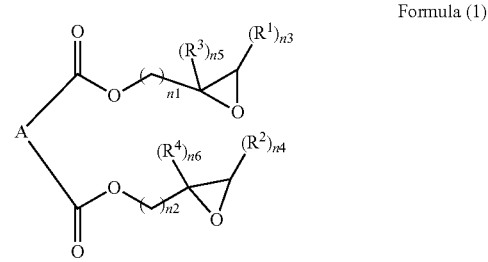

Formula (1)

[in Formula (1), A is a monocyclic aliphatic hydrocarbon group optionally containing an epoxy group; $R^1$, $R^2$, $R^3$ and $R^4$ are independently a hydrogen atom or a $C_{1-10}$ alkyl group; n1 and n2 are independently an integer of 2 to 6; n3 and n4 are individually an integer of 2; and n5 and n6 are individually an integer of 1], and an acid generator.

9 Claims, No Drawings

EPDXY RESIN COMPOSITION HAVING MONOCYCLIC ALIPHATIC HYDROCARBON RING

TECHNICAL FIELD

The present invention relates to a photocurable or thermosetting epoxy resin composition. More in detail, the present invention relates to a photocurable or thermosetting resin composition (a resin composition for electronic materials and optical materials) useful for obtaining a cured product having excellent characteristics such as high adhesion to a substrate, high transparency (transparency for a visible light ray), hard coating properties, and high heat resistance, and a cured product (cured composite) thereof.

BACKGROUND ART

Conventionally, epoxy resins are used widely in the electronic material fields as an epoxy resin composition in combination with a curing agent. Among the electronic material fields, for example, in the applications such as a high refractive-index layer in an antireflective film (an antireflective film for a liquid crystal display and the like), an optical thin film (such as a reflecting plate), a sealant for electronic parts, a printed wiring substrate, and an interlayer insulation film material (an interlayer insulation film material for a built-up printed substrate, and the like), performances such as high adhesion to a base material, hard coating property, high heat resistance, and high transparency for visible light are required for a molding material.

Epoxy resin compositions containing an epoxy resin with a photoacid generator and a thermal acid generator use no solvent, and can cure the epoxy resin alone, so that in recent years, many studies have been performed over the epoxy resin compositions. Particularly, cationic photocuring with an ultraviolet ray is extremely excellent in terms of requiring no large oven for curing and injecting a small amount of energy.

Although alicyclic epoxy compounds having an epoxy group only in the alicyclic structure has high reactivity for cationic curing using light, so that such an alicyclic epoxy compound is widely used for cationic curing, the structure thereof is rigid, so that a cured product thereof tends to become rigid and brittle.

Glycidyl ether-type or glycidyl ester-type epoxy compounds that are conventional general-purpose epoxy compounds, represented by bisphenol-type epoxy compounds, have low reactivity relative to an acid generator and consequently, the reaction therebetween takes much time, so that such epoxy compounds have been generally considered as not suitable for cationic curing.

A resin containing a carboxy group produced using an epoxy alkyl ester of a cyclohexane dicarboxylic acid having an epoxy group as a crosslinkable compound has been disclosed (see Patent Document 1).

RELATED-ART DOCUMENT

Patent Document

Patent Document 1: U.S. Pat. No. 3,565,922 specification

SUMMARY OF THE INVENTION

Problem to be Solved by the Invention

As a result of assiduous research, the inventors of the present invention have found that by lengthening a side chain between a carboxy group and an epoxy group in a substituent with which a monocyclic aliphatic hydrocarbon ring such as a cyclohexane ring is substituted, cationic curability can be imparted to an epoxy compound, and have completed the present invention. That is, the present invention provides a curable composition having a low viscosity and high cationic curability. A cured product obtained from the curable composition has high toughness.

Means for Solving the Problem

The present invention provides, according to a first aspect, a curable composition containing an epoxy compound of Formula (1):

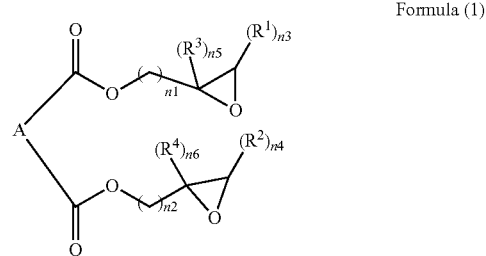

Formula (1)

[in Formula (1), A is a monocyclic aliphatic hydrocarbon group optionally containing an epoxy group; $R^1$, $R^2$, $R^3$ and $R^4$ are independently a hydrogen atom or a $C_{1-10}$ alkyl group; n1 and n2 are independently an integer of 2 to 6; n3 and n4 are individually an integer of 2; n5 and n6 are individually an integer of 1]; and an acid generator, according to a second aspect, the curable composition according to the first aspect, in which A in Formula (1) is a cyclohexyl group containing an epoxy group, according to a third aspect, the curable composition according to the first aspect, in which n1 and n2 in Formula (1) are individually 2, and $R^1$, $R^2$, $R^3$ and $R^4$ are individually a hydrogen atom, according to a fourth aspect, the curable composition according to the first aspect, in which n1 and n2 in Formula (1) are individually 3, and $R^1$, $R^2$, $R^3$ and $R^4$ are individually a hydrogen atom, according to a fifth aspect, the curable composition according to the first aspect, in which n1 and n2 in Formula (1) are individually 4, and $R^1$, $R^2$, $R^3$ and $R^4$ are individually a hydrogen atom, according to a sixth aspect, the curable composition according to any one of the first aspect to the fifth aspect, in which the acid generator is a photoacid generator or a thermal acid generator, according to a seventh aspect, the curable composition according to any one of the first aspect to the sixth aspect, in which the acid generator is an onium salt, according to an eighth aspect, the curable composition according to any one of the first aspect to the sixth aspect, in which the acid generator is a sulfonium salt compound or an iodonium salt compound, and according to a ninth aspect, the curable composition according to any one of the first aspect to the eighth aspect, in which the curable composition contains the acid generator in a ratio of 0.1 to 20% by mass, based on the mass of the epoxy compound.

Effects of the Invention

In an epoxy resin produced by photocuring or thermally curing a compound in which an epoxy ring is bonded, through an alkylene group, to an oxygen atom on a carboxy group with which a monocyclic aliphatic hydrocarbon ring such as a cyclohexane ring is substituted, the longer the alkylene group is, the larger the degree of freedom of the epoxy ring is and the higher the reactivity of the epoxy resin is, so that all epoxy groups are involved in the reaction and the cationic curability of the epoxy resin becomes high. Because the curable composition of the present invention can be quickly cured, it is possible to reduce an additive amount of the acid generator and to use a weak acid-based acid generator. After irradiation of an UV ray, an acid active species derived from the acid generator may remain, so that it is important for preventing a metal corrosion to reduce the amount of the acid generator to be used. Furthermore, because the curable composition of the present invention can be quickly cured, curing of a thick film is possible.

When the curable composition of the present invention containing an epoxy compound having a carboxylic acid ester with which a monocyclic aliphatic hydrocarbon ring such as a cyclohexane ring is substituted, and an acid generator is subjected to photocuring, it is expected that a cured product or a cured coating film capable of compatibilizing excellent mechanical characteristics with excellent optical characteristics can be formed. Particularly, by lengthening the alkylene group between the carboxy group substituted to a monocyclic aliphatic hydrocarbon ring and the epoxy group, it is expected that toughness of the cured product becomes high.

In the present invention, a liquid epoxy compound is photocured or thermally cured using a photoacid generator or a thermal acid generator. Accordingly, by using a photoacid generator or a thermal acid generator, a curing agent (for example, an amine or an acid anhydride) for an epoxy compound that is usually used is not used or even when such a curing agent is used, the content thereof is extremely low, so that the curable composition of the present invention has advantageous preservation stability.

The curable composition of the present invention is cured by photocuring by UV irradiation, so that the curable composition can be applied to the production of a material (machinery material) that is not resistant to heat.

Furthermore, the epoxy compound used in the present invention has a low viscosity, so that the curable composition of the present invention has advantageous filling properties.

The cured product formed from the curable composition of the present invention has characteristics such as low viscosity and fast curing and can be applied to coating or adhering electronic parts, optical parts, or precise machine parts.

MODES FOR CARRYING OUT THE INVENTION

The present invention is a curable composition containing an epoxy compound of Formula (1) and an acid generator.

The curable composition of the present invention may contain besides the epoxy compound of Formula (1) and the acid generator, if necessary, a solvent, another epoxy compound, a curing agent, a surfactant, and an adhesion accelerator.

The ratio of the solid component in the curable composition of the present invention is 1 to 100% by mass, 5 to 100% by mass, 50 to 100% by mass, or 80 to 100% by mass.

Here, the solid component is a component remaining after removing a solvent from all components of the curable composition. In the present invention, although a liquid epoxy compound to which an acid generator is mixed is used, so that a solvent is not necessary basically, it is possible to add a solvent if necessary. For example, when the acid generator is solid, by dissolving the acid generator in a solvent such as propylene carbonate and mixing the resultant solution with the liquid epoxy compound, the curable composition can be produced. Even when the acid generator is dissolved in the liquid epoxy compound, for adjusting the viscosity of the obtained curable composition, a general solvent may be added.

The ratio of the epoxy compound of Formula (1) in the curable composition of the present invention is 8 to 99.9% by mass, preferably 40 to 99% by mass, further preferably 70 to 99% by mass, based on the mass of the solid component contained in the curable composition.

The ratio of the acid generator in the curable composition of the present invention is 0.1 to 20% by mass or 0.1 to 10% by mass, based on the mass of the solid component contained in the curable composition. The curable composition of the present invention may contain the acid generator in a ratio of 0.1 to 20% by mass, or 0.1 to 10% by mass, based on the mass of the epoxy compound of Formula (1).

In Formula (1), A is a monocyclic aliphatic hydrocarbon group optionally containing an epoxy group. Examples of the monocyclic aliphatic hydrocarbon group optionally containing an epoxy group include a cyclic substituent such as a cyclobutyl group, a cyclopentyl group, a cyclohexyl group, a cyclooctyl group, an epoxycyclobutyl group, an epoxycyclopentyl group, an epoxycyclohexyl group, and an epoxycyclooctyl group.

The monocyclic aliphatic hydrocarbon group preferably contains an epoxy group and, for example, an epoxycyclohexyl group is preferably used. The monocyclic aliphatic hydrocarbon group may contain besides the epoxy group, an alkyl group such as a methyl group as a substituent.

In Formula (1), $R^1$, $R^2$, $R^3$ and $R^4$ are independently a hydrogen atom or a $C_{1-10}$ alkyl group; n1 and n2 are independently an integer of 2 to 6; n3 and n4 are individually an integer of 2; and n5 and n6 are individually an integer of 1.

Examples of the $C_{1-10}$ alkyl group include a methyl group, an ethyl group, an n-propyl group, an isopropyl group, a cyclopropyl group, an n-butyl group, an isobutyl group, a sec-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1- methyl-cyclopropyl group, a 2-ethyl-2-methyl-cyclopropyl group, and a 2-ethyl-3-methyl-cyclopropyl group.

In the present invention, an epoxy compound having a 3,4-epoxybutyl group in which in Formula (1), n1 and n2 are individually 2 (integer) and $R^1$, $R^2$, $R^3$ and $R^4$ are individually a hydrogen atom, can be used and this epoxy compound is a compound of Formula (1-1) below.

In addition, in the present invention, an epoxy compound having a 4,5-epoxypentyl group in which in Formula (1), n1 and n2 are individually 3 (integer) and $R^1$, $R^2$, $R^3$ and $R^4$ are individually a hydrogen atom, can be used and this epoxy compound is a compound of Formula (1-2) below.

Furthermore, in the present invention, an epoxy compound having a 5,6-epoxyhexyl group in which in Formula (1), n1 and n2 are individually 4 (integer) and $R^1$, $R^2$, $R^3$ and $R^4$ are individually a hydrogen atom, can be used and this epoxy compound is a compound of Formula (1-3) below.

The epoxy compound of Formula (1) is exemplified as follows.

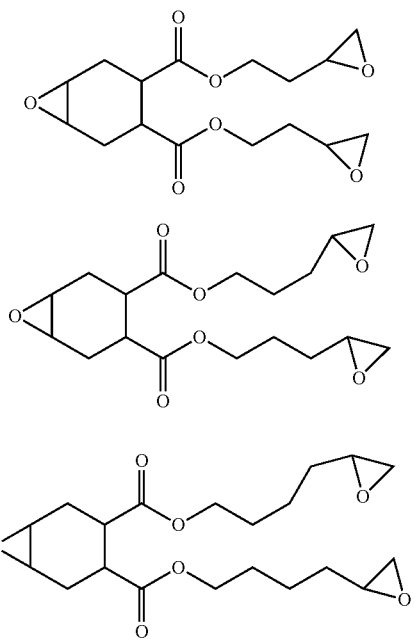

The epoxy compound of Formula (1) can be produced, for example, by reacting a cycloalkene dicarboxylic anhydride and a $C_{4-8}$ alkenol and then reacting the obtained compound having an unsaturated bond (intermediate) and a peroxide.

Examples of the cycloalkene dicarboxylic anhydride include 4-cyclohexene-1,2-dicarboxylic anhydride, 4-methyl-4-cyclohexene-1,2-dicarboxylic anhydride, 3-methyl-4-cyclohexene-1,2-dicarboxylic anhydride, and a mixture thereof.

Examples of the alkenol include 3-butene-1-ole, 4-pentene-1-ole, 5-hexene-1-ole, 3-hexene-1-ole, and 3-methyl-3-butene-1-ole. These alkenols are shown, for example, as follows.

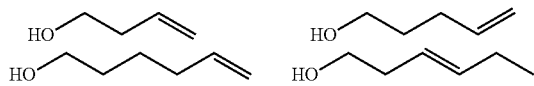

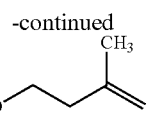

The compound having an unsaturated bond (intermediate) is shown below.

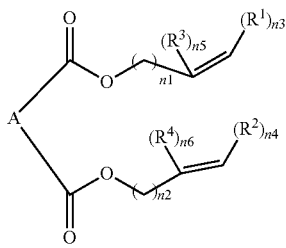

[where A is a monocyclic aliphatic hydrocarbon group optionally containing an unsaturated bond; $R^1$, $R^2$, $R^3$ and $R^4$ are independently a hydrogen atom or a $C_{1-10}$ alkyl group; n1 and n2 are independently an integer of 2 to 6; n3 and n4 are individually an integer of 2; and n5 and n6 are individually an integer of 1].

That is, the epoxy compound of Formula (1) used in the present invention can be obtained, when Formula (1-2) is exemplified, by the method below.

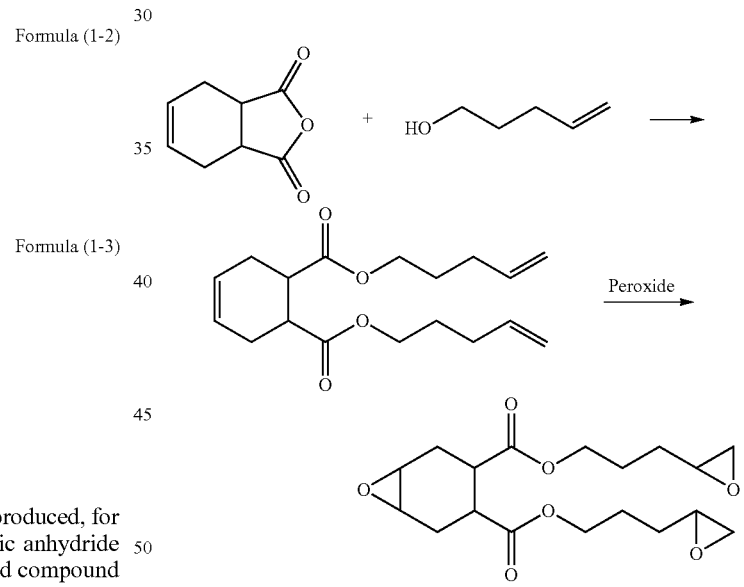

In the above reaction, 4-cyclohexene-1,2-dicarboxylic anhydride and 4-pentene-1-ole are reacted to synthesize bis(4-pentenyl)-4-cyclohexene-1,2-dicarboxylic acid ester. This reaction can be effected in a solvent such as toluene by using a catalyst such as p-toluenesulfonic acid at room temperature to 110° C. for 0 to 20 hours. Then, this triene compound is oxidized with a peroxide to obtain an epoxy compound. Examples of the peroxide include methachloroperbenzoic acid, peracetic acid, and hydrogen peroxide-tungstic acid. This reaction can be effected in a solvent such as chloroform at 0 to 60° C. for 1 to 20 hour(s). The intermediate bis(4-pentenyl)-4-cyclohexene-1,2-dicarboxylic acid ester can also be obtained by reacting 4-cyclohexene-1,2-dicarboxylic acid and 4-pentene-1-ole by using a catalyst such as p-toluenesulfonic acid.

In the present invention, the epoxy compound of Formula (1) can be used in combination with another epoxy compound. The epoxy compound of Formula (1) and another epoxy compound can be used in a molar ratio of the epoxy group ranging from 1:0.1 to 1:0.5.

Examples of the epoxy compound other than the epoxy compound of Formula (1) include compounds exemplified below.

Solid epoxy compound: tris-(2,3-epoxypropyl)-isocyanurate (of Formula (2-1), trade name: TEPIC, manufactured by Nissan Chemical Industries, Ltd.)

Formula (2-1)

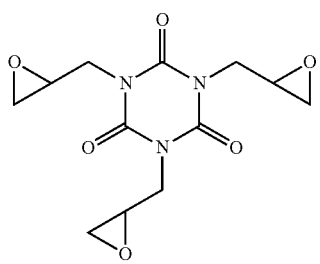

Liquid epoxy compound: (of Formula (2-2), trade name: Epikote 828, manufactured by Japan Epoxy Resin Co., Ltd.)

Formula (2-2)

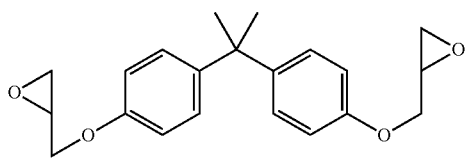

Liquid epoxy compound: (of Formula (2-3), trade name: YX8000, manufactured by Japan Epoxy Resin Co., Ltd.)

Formula (2-3)

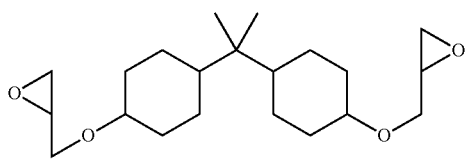

Liquid epoxy compound: (of Formula (2-4), trade name: DME100 manufactured by New Japan Chemical Co., Ltd.)

Formula (2-4)

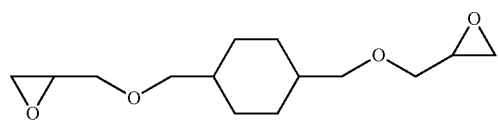

Liquid epoxy compound: (of Formula (2-5), trade name: CE-2021P, manufactured by Daicel Corporation)

Formula (2-5)

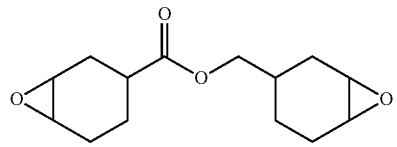

In the present invention, as liquid epoxy compounds, tris-(3,4-epoxybutyl)-isocyanurate (of Formula (2-6)), tris-(4,5-epoxypentyl)-isocyanurate (of Formula (2-7)), and tris-(5,6-epoxyhexyl)-isocyanurate (of Formula (2-8)) below can be used.

Formula (2-6)

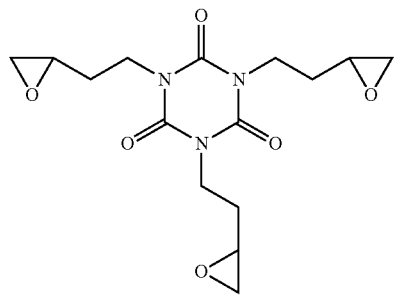

Formula (2-7)

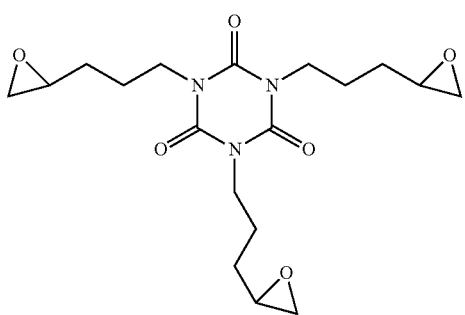

Formula (2-8)

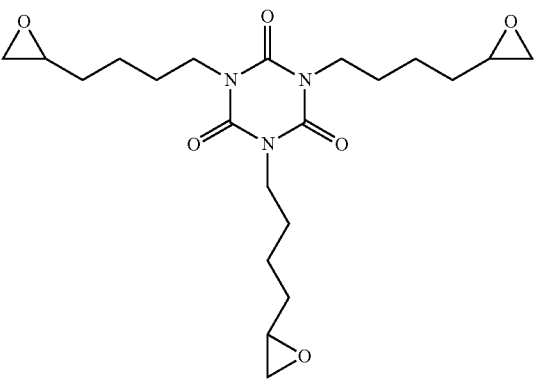

Liquid epoxy compound: (of Formula (2-9), manufactured by Nissan Chemical Industries, Ltd., trade name: TEPIC-PAS B22) prepared by adding 0.8 mol of propionic anhydride to 1 mol of tris-(2,3-epoxypropyl)-isocyanurate to modify tris-(2,3-epoxypropyl)-isocyanurate. The compound of Formula (2-9) contains a compound of Formula (2-9-1), a compound of Formula (2-9-2), a compound of Formula (2-9-3), and a compound of Formula (2-9-4) in a molar ratio of (2-9-1):(2-9-2):(2-9-3):(2-9-4)=about 35%:45%:17%:3%.

Formula (2-9)

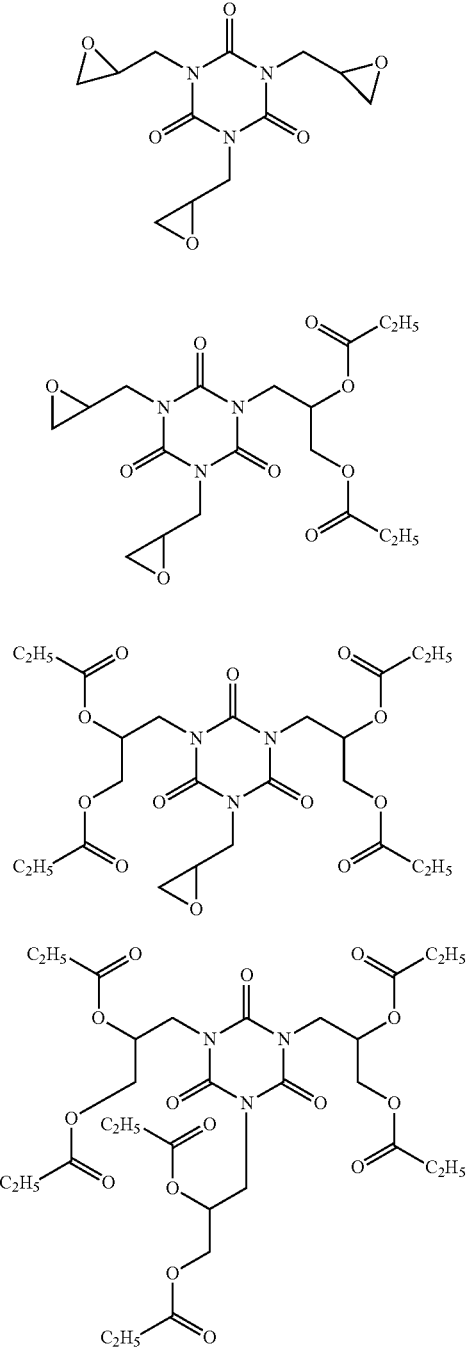

Liquid epoxy compound: (of Formula (2-10), manufactured by Nissan Chemical Industries, Ltd., trade name: TEPIC-PAS B26) prepared by adding 0.4 mol of propionic anhydride to 1 mol of tris-(2,3-epoxypropyl)-isocyanurate to modify tris-(2,3-epoxypropyl)-isocyanurate. The compound of Formula (2-10) contains a compound of Formula (2-10-1), a compound of Formula (2-10-2), and a compound of Formula (2-10-3) in a molar ratio of (2-10-1):(2-10-2):(2-10-3) =about 60%:32%:8%.

Formula (2-10)

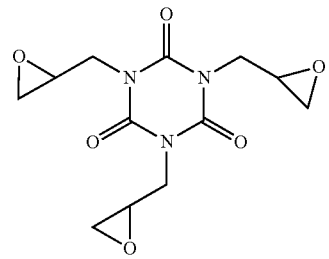

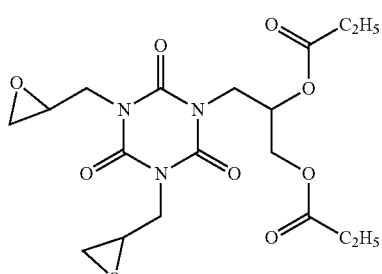

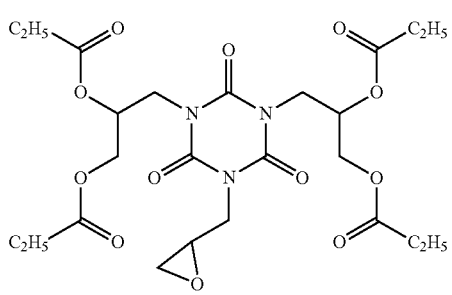

In the present invention, as the cationic curable monomer, besides the epoxy compound, a vinyl ether compound, an oxetane compound, a carbonate compound, a dithiocarbonate compound, and the like can be used.

The compound containing a vinyl group (such as a vinyl ether compound) is not particularly limited so long as the compound containing a vinyl group is a compound having a vinyl group and examples thereof include 2-hydroxyethyl vinyl ether (HEVE), diethylene glycol monovinyl ether (DEGV), 2-hydroxybutyl vinyl ether (HBVE), and triethylene glycol divinyl ether. In addition, a vinyl compound having a substituent such as an alkyl group and an allyl group at an α and/or β position can also be used. Furthermore, a vinyl ether compound containing a cyclic ether group such as an epoxy group and/or an oxetane group can be used and examples of such a vinyl ether compound include oxynorbornene divinyl ether and 3,3-dimethanoloxetane divinyl ether. In addition, a hybrid compound having a vinyl group and a (meth)acryl group can be used and examples of the hybrid compound include 2-(2-vinyloxyethoxy)ethyl(meth)acrylate (VEEA, VEEM). These compounds may be used individually or in combination of two or more of them.

The compound containing an oxetanyl group (oxetane compound) is not particularly limited so long as the compound containing an oxetanyl group is a compound having an oxetanyl group and examples thereof include 3-ethyl-3-(phenoxymethyl)oxetane (PDX), di[1-ethyl(3-oxetanyl)]methyl ether (DOX), 3-ethyl-3-(2-ethylhexyloxymethyl)oxetane (EHOX), 3-ethyl-3-{[3-(triethoxysilyl)propoxy]methyl}oxetane (TESOX), oxetanyl silsesquioxane (OX- SQ), and phenol novolac oxetane (PNOX-1009). In addition, a hybrid compound (1-ethyl-3-oxetanylmethyl(meth)acrylate) having an oxetanyl group and a (meth)acryl group can be used. These oxetane-based compounds may be used individually or in combination of two or more of them.

The carbonate compound and the dithiocarbonate compound are not particularly limited so long as they are a compound having in the molecule thereof, a carbonate group or a dithiocarbonate group.

As the acid generator used in the present invention, photoacid generators and thermal acid generators can be used.

The photoacid generators or the thermal acid generators are not particularly limited so long as they generate an acid directly or indirectly by light irradiation or heating.

Specific examples of the photoacid generator include a triazine-based compound, an acetophenone derivative compound, a disulfon-based compound, a diazomethane-based compound, a sulfonic acid derivative compound, an onium salt such as an iodonium salt, a sulfonium salt, a phosphonium salt, and a selenium salt, a metallocene complex, and an iron arene complex.

Examples of the iodonium salt include diphenyliodonium chloride, diphenyliodonium trifluoromethane sulfonate, diphenyliodonium mesylate, diphenyliodonium tosylate, diphenyliodonium bromide, diphenyliodonium tetrafluoroborate, diphenyliodonium hexafluoro antimonate, diphenyliodonium hexafluoro arsenate, bis(p-tert-butylphenyl)iodonium hexafluoro phosphate, bis(p-tert-butylphenyl)iodonium mesylate, bis(p-tert-butylphenyl)iodonium tosylate, bis(p-tert-butylphenyl)iodonium trifluoromethane sulfonate, bis(p-tert-butylphenyl)iodonium tetrafluoroborate, bis(p-tert-butylphenyl)iodonium chloride, bis(p-chlorophenyl)iodonium chloride, and bis(p-chlorophenyl)iodonium tetrafluoroborate. Furthermore, examples of the iodonium salt include a bis(alkylphenyl)iodonium salt such as bis(4-tert-butylphenyl)iodonium hexafluoro phosphate, an alkoxycarbonylalkoxy-trialkylaryl-iodonium salt (for example, 4-[(1-ethoxycarbonyl-ethoxy)phenyl]-(2,4,6-trimethylphenyl)-iodonium hexafluoro phosphate), and a bis(alkoxyaryl)iodonium salt (for example, a bis(alkoxyphenyl)iodonium salt such as (4-methoxyphenyl)phenyliodonium hexafluoro antimonate).

Examples of the sulfonium salt include a triphenylsulfonium salt such as triphenylsulfonium chloride, triphenylsulfonium bromide, tri(p-methoxyphenyl)sulfonium tetrafluoroborate, tri(p-methoxyphenyl)sulfonium hexafluoro phosphonate, tri(p-ethoxyphenyl)sulfonium tetrafluoroborate, triphenylsulfonium triflate, triphenylsulfonium hexafluoro antimonate, and triphenylsulfonium hexafluoro phosphate, (4-phenylthiophenyl)diphenylsulfonium hexafluoro antimonate, (4-phenylthiophenyl)diphenylsulfonium hexafluoro phosphate, bis[4-(diphenylsulfonio)phenyl]sulfide-bis-hexafluoro antimonate, bis[4-(diphenylsulfonio)phenyl]sulfide-bis-hexafluoro phosphate, and (4-methoxyphenyl)diphenylsulfonium hexafluoro antimonate.

Examples of the phosphonium salt include triphenylphosphonium chloride, triphenylphosphonium bromide, tri(p-methoxyphenyl)phosphonium tetrafluoroborate, tri(p-methoxyphenyl)phosphonium hexafluoro phosphonate, tri(p-ethoxyphenyl)phosphonium tetrafluoroborate, 4-chlorobenzenediazonium hexafluoro phosphate, and benzyltriphenylphosphonium hexafluoro antimonate.

Examples of the metallocene complex include a selenium salt such as triphenylselenium hexafluoro phosphate, and (η5 or η6-isopropylbenzene)(η5-cyclopentadienyl) iron(II) hexafluoro phosphate.

In addition, as the photoacid generator, the compounds below can also be used.

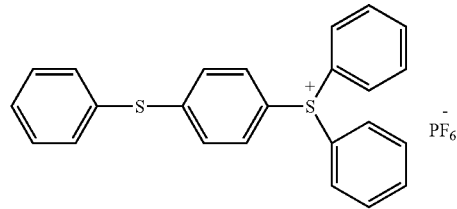

Formula (B-1)

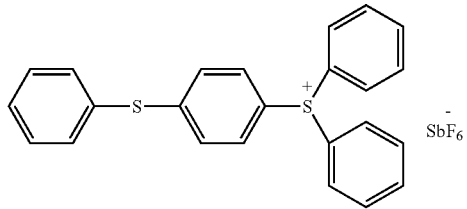

Formula (B-2)

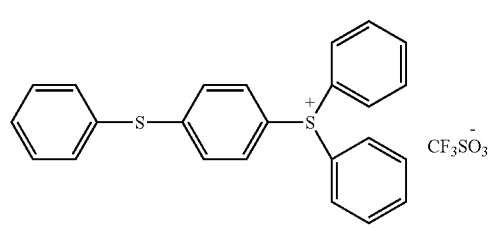

Formula (B-3)

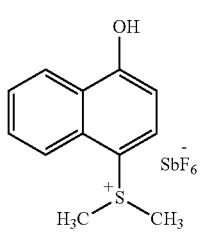

Formula (B-4)

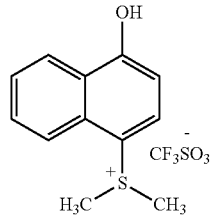

Formula (B-5)

Formula (B-6)

-continued
Formula (B-7)
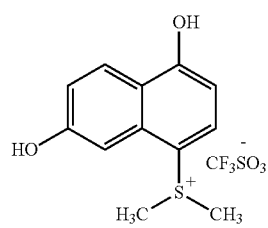
Formula (B-8)
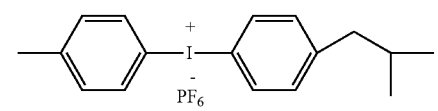
Formula (B-9)
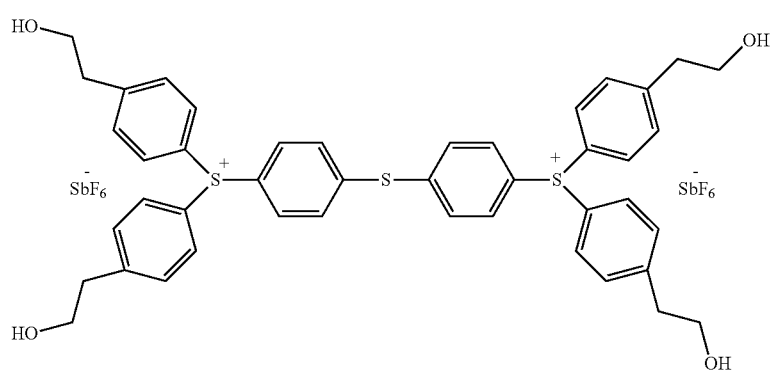
Formula (B-10)
Formula (B-11)
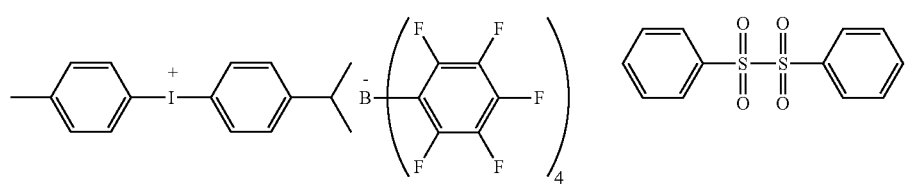
Formula (B-12)
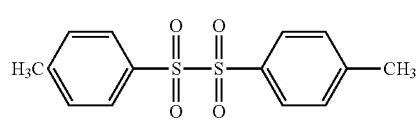
Formula (B-13)
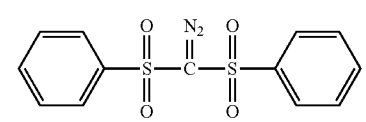
Formula (B-14)
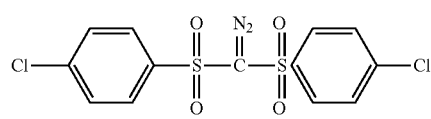
Formula (B-15)
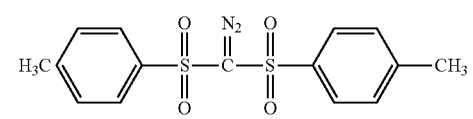
Formula (B-16)
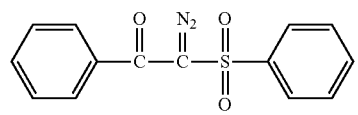
Formula (B-17)
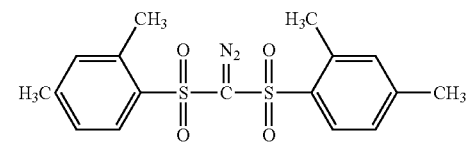
Formula (B-18)
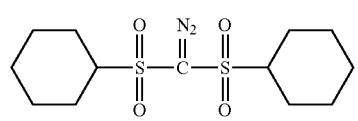
Formula (B-19)
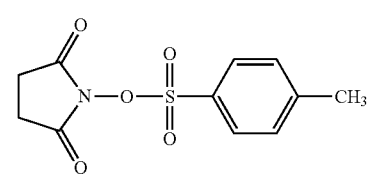
Formula (B-20)
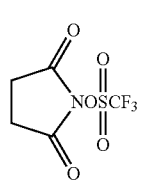
Formula (B-21)
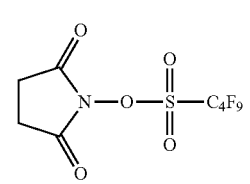

-continued

Formula (B-22)

Formula (B-23)

Formula (B-24)

Formula (B-25)

Formula (B-26)

Formula (B-27)

Formula (B-28)

Formula (B-29)

Formula (B-30)

Formula (B-31)

Formula (B-32)

Formula (B-33)

Formula (B-34)

Formula (B-35)

Formula (B-36)

Formula (B-37)

Formula (B-38)

Formula (B-39)

-continued
Formula (B-40)
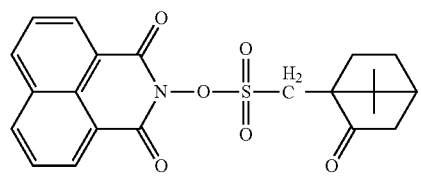
Formula (B-41)
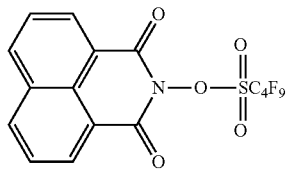
Formula (B-42)
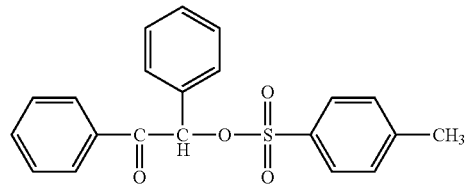
Formula (B-43)
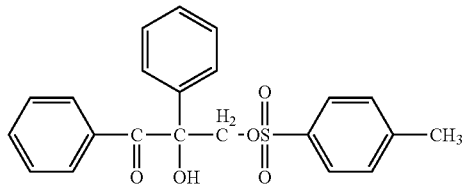
Formula (B-44)
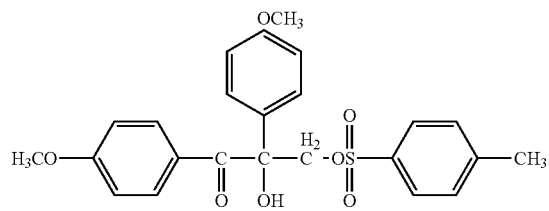
Formula (B-45)
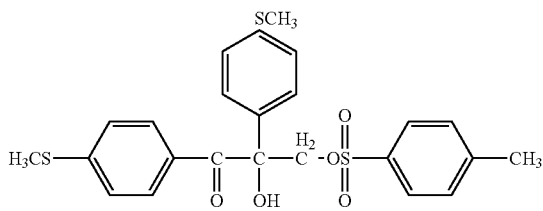
Formula (B-46)
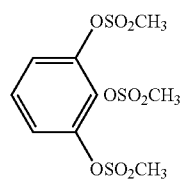
Formula (B-47)
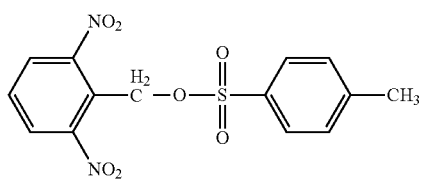
Formula (B-48)
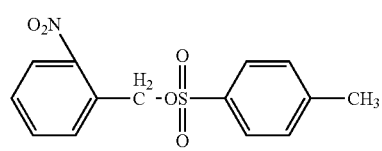
Formula (B-49)
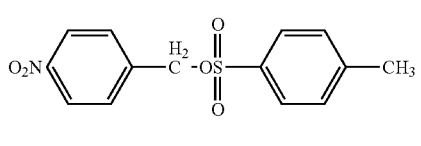
Formula (B-50)
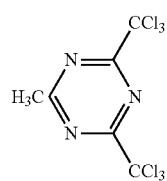
Formula (B-51)
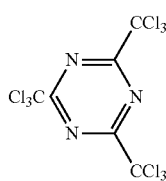
Formula (B-52)
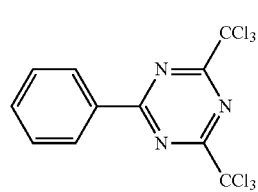
Formula (B-53)
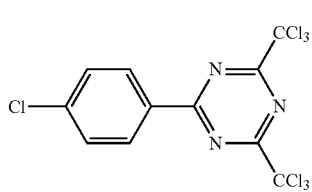
Formula (B-54)
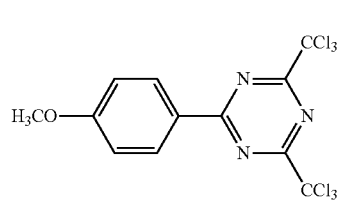
Formula (B-55)
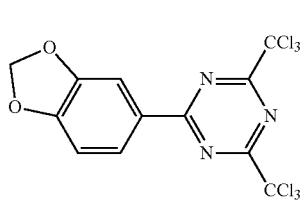

-continued

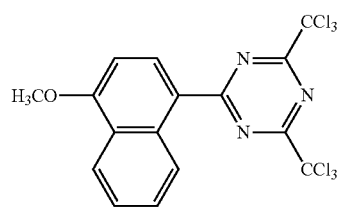
Formula (B-56)

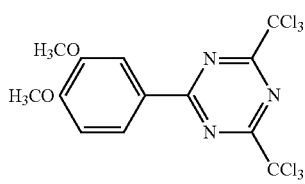
Formula (B-57)

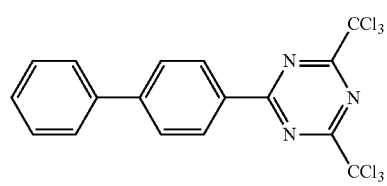
Formula (B-58)

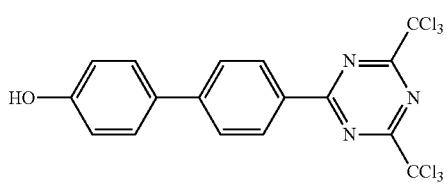
Formula (B-59)

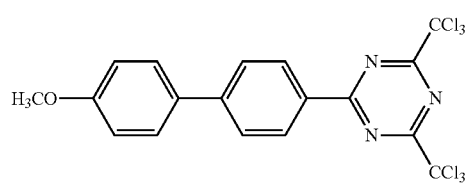
Formula (B-60)

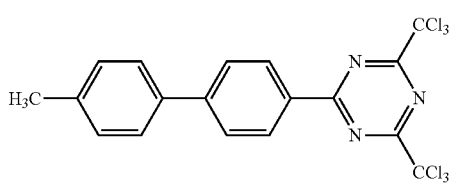
Formula (B-61)

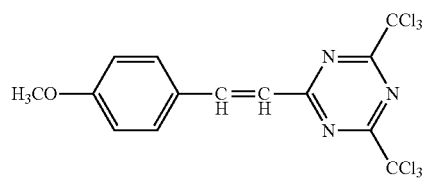
Formula (B-62)

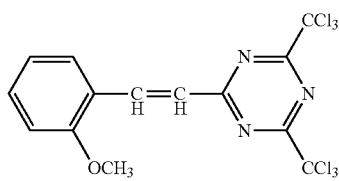
Formula (B-63)

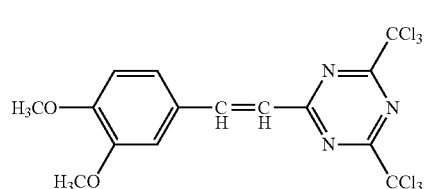
Formula (B-64)

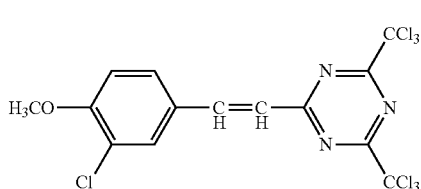
Formula (B-65)

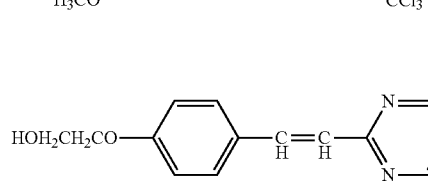
Formula (B-66)

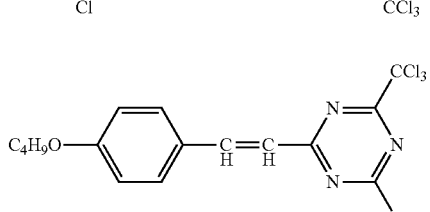
Formula (B-67)

As the photoacid generator, sulfonium salt compounds and iodonium salt compounds are preferred. Examples of the anion species thereof include $CF_3SO_3^-$, $C_4F_9SO_3^-$, $C_8F_{17}SO_3^-$, camphorsulfonic acid anion, tosylic acid anion, $BF_4^-$, $PF_6^-$, $AsF_6^-$, and $SbF_6^-$. Particularly, an anion species such as phosphorus hexafluoride and antimony hexafluoride exhibiting strong acidity is preferred.

As the photoacid generator, for example, compounds of Formula (B-1), Formula (B-2), Formula (B-3), Formula (B-8), Formula (B-9), and Formula (B-10) are preferred and particularly, compounds of Formula (B-1) and Formula (B-2) are preferred. These photoacid generators may be used individually or in combination of two or more of them.

Examples of the thermal acid generator include sulfonium salts and phosphonium salts, and sulfonium salts are preferably used.

In addition, as the thermal acid generator, the compounds below can also be exemplified.

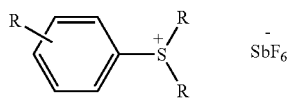
Formula (C-1)

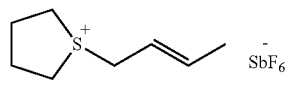
Formula (C-2)

In Formula (C-1), Rs are independently a $C_{1-12}$ alkyl group or a $C_{6-20}$ aryl group, particularly a $C_{1-12}$ alkyl group is preferable. These thermal acid generators may be used individually or in combination of two or more of them.

The curable composition of the present invention may contain a solvent. Examples of the solvent include: alcohols such as methanol and ethanol; ethers such as tetrahydrofuran; glycol ethers such as ethylene glycol monomethyl ether and ethylene glycol monoethyl ether; ethylene glycol alkyl ether acetates such as methylcellosolve acetate and ethylcellosolve acetate; diethylene glycols such as diethylene glycol monomethyl ether, diethylene glycol monoethyl ether, diethylene glycol dimethyl ether, diethylene glycol diethyl ether, and diethylene glycol ethyl methyl ether; propylene glycol monoalkyl ethers such as propylene glycol methyl ether, propylene glycol ethyl ether, propylene glycol propyl ether, and propylene glycol butyl ether; propylene glycol alkyl ether acetates such as propylene glycol methyl ether acetate, propylene glycol ethyl ether acetate, propylene glycol propyl ether acetate, and propylene glycol butyl ether acetate; propylene glycol alkyl ether acetates such as propylene glycol methyl ether propionate, propylene glycol ethyl ether propionate, propylene glycol propyl ether propionate, and propylene glycol butyl ether propionate; aromatic hydrocarbons such as toluene and xylene; ketones such as methyl ethyl ketone, cyclohexanone, and 4-hydroxy-4-methyl-2-pentanone; and esters such as methyl acetate, ethyl acetate, propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, and butyl 3-butoxypropionate.

The curable composition of the present invention may contain, if necessary, a general-purpose additive. Examples of such an additive include a pigment, a colorant, a thickener, a sensitizer, an antifoamer, a leveling agent, a coating property improving agent, a lubricant, a stabilizer (such as antioxidant, heat stabilizer, and light stabilizer), a plasticizer, a surfactant, a dissolution accelerator, a filler, an antistatic agent, and a curing agent. These additives may be used individually or in combination of two or more of them.

In the curable composition of the present invention, for the purpose of enhancing coating property, a surfactant may be added. The surfactant is not particularly limited and examples thereof include a fluorinated surfactant, a silicone-based surfactant, and a nonioic surfactant. These surfactants may be used individually or in combination of two or more of them.

Among these surfactants, in terms of having high coating property improving effect, a fluorinated surfactant is preferred. Specific examples of the fluorinated surfactant include trade name: EFTOP [registered trade mark] EF301, EF303, EF352 (manufactured by Mitsubishi Materials Electronic Chemicals Co., Ltd. (Tohkem Products Co., Ltd.)); trade name: MEGAFAC [registered trade mark] F171, F173, R-30, R-08, R-90, BL-20, F-482 (manufactured by DIC Corporation (Dainihon Ink & Chemicals Inc.)); trade name: Fluorad FC430, FC431 (manufactured by Sumitomo 3M Limited); and trade name: Asahi Guard [registered trade mark] AG710, Surfron [registered trade mark] S-382, SC101, SC102, SC103, SC104, SC105, SC106 (manufactured by Asahi Glass Co., Ltd.), to which the specific examples are not limited.

The ratio of the surfactant in the curable composition of the present invention is 0.0008 to 4.5% by mass, preferably 0.0008 to 2.7% by mass, more preferably 0.0008 to 1.8% by mass, based on the mass of the solid component contained in the curable composition.

In the curable composition of the present invention, for the purpose of enhancing the adhesion of the curable composition to a substrate after development, an adhesion accelerator may be added. Examples of the adhesion accelerator include: chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, γ-methacryloxypropyltrimethoxysilane, γ-glycidoxypropyltrimethoxysilane, γ-(N-piperidinyl)propyltrimethoxysilane; a heterocyclic compound such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and a urea or thiourea compound such as 1,1-dimethylurea and 1,3-dimethylurea. These adhesion accelerators may be used individually or in combination of two or more of them.

The ratio of the adhesion accelerator in the curable composition of the present invention is usually 18% by mass or less, preferably 0.0008 to 9% by mass, more preferably 0.04 to 9% by mass, based on the mass of the solid component contained in the curable composition.

The curable composition of the present invention may contain a sensitizer. Examples of the sensitizer include anthracene, phenothiazine, perylene, thioxanthone, and benzophenone-thioxanthone. Examples of the sensitizing dyestuff include a thiopyrylium salt-based dyestuff, a merocyanine-based dyestuff, a quinoline-based dyestuff, a styrylquinoline-based dyestuff, a ketocoumarin-based dyestuff, a thioxanthene-based dyestuff, a xanthene-based dyestuff, an oxonol-based dyestuff, a cyanine-based dyestuff, a rhodamine-based dyestuff, and a pyrylium salt-based dyestuff. Particularly preferred is an anthracene-based sensitizer and by using the anthracene-based sensitizer in combination with a cationic curing catalyst (radiation-sensitive cationic polymerization initiator), the curable composition not only enhances the sensitivity thereof dramatically, but also has a radical polymerization initiating function. Accordingly, in a hybrid curing system like in the present invention using a cationic curing system in combination with a radical curing system, the catalyst species can be simply selected. As a specific anthracene compound, dibutoxyanthracene, dipropoxyanthraquinone, and the like are effective.

The ratio of the sensitizer in the curable composition of the present invention is 0.01 to 20% by mass, preferably 0.01 to 10% by mass, based on the mass of the solid component contained in the curable composition.

In the present invention, the curable composition containing the epoxy compound of Formula (1) and the photoacid generator is applied onto a substrate and by irradiating the curable composition with light, the curable composition can be cured. Before or after the light irradiation, the curable composition can be heated.

In the present invention, the curable composition containing the epoxy compound of Formula (1) and the thermal acid generator is applied onto a substrate and by heating the curable composition, the curable composition can be cured.

Furthermore, in the present invention, the curable composition containing the epoxy compound of Formula (1) and the thermal acid generator and the photoacid generator is applied onto a substrate and by heating the curable composition and then, by irradiating the curable composition with light, the curable composition can be cured.

Examples of the method for applying the curable composition of the present invention onto a substrate include a flow coating method, a spin coating method, a spray coating method, a screen printing method, a casting method, a bar coating method, a curtain coating method, a roll coating method, a gravure coating method, a dipping method, and a slit method.

The thickness of the coating film formed from the curable composition of the present invention can be selected from a range of 0.01 μm to around 10 mm according to the application of the cured product. For example, when the coating film is applied to a photoresist, the thickness of the coating film may be 0.05 to around 10 μm (particularly 0.1 to 5 μm); when the coating film is applied to a printed wiring substrate, the thickness may be 10 μm to around 5 mm (particularly 100 μm to 1 mm); and when the coating film is applied to an optical thin film, the thickness may be 0.1 to around 100 μm (particularly 0.3 to 50 μm).

Examples of the light used for light irradiation or exposure to light when the photoacid generator is used include a gamma ray, an X ray, an ultraviolet ray, and a visible light ray and usually, a visible light ray or an ultraviolet ray, particularly, an ultraviolet ray is frequently used.

The wavelength of the light is around, for example 150 to 800 nm, preferably 150 to 600 nm, further preferably 200 to 400 nm, particularly preferably 300 to 400 nm.

Although the dose of the irradiated light is varied depending on the thickness of the coating film, the dose may be around, for example 2 to 20,000 mJ/cm$^2$, preferably 5 to 5,000 mJ/cm$^2$.

The light source can be selected according to the type of the light ray used for exposure to light and examples of the light source when the ultraviolet ray is used include a low pressure mercury lamp, a high pressure mercury lamp, a ultrahigh pressure mercury lamp, a deuterium lamp, a halogen lamp, and laser light (such as helium-cadmium laser and excimer laser). By such light irradiation, the curing reaction of the curable composition of the present invention containing the epoxy compound of Formula (1) and the photoacid generator is progressed.

The heating of the coating film performed if necessary after heating when the thermal acid generator is used or after light irradiation when the photoacid generator is used, is performed, for example, at around 60 to 250° C., preferably at around 100 to 200° C. The heating time can be selected from a range of 3 seconds or more (for example, 3 seconds to around 5 hours) and is, for example, 5 seconds to 2 hours, preferably 20 seconds to around 30 minutes, usually 1 minute to around 3 hours (for example, 5 minutes to 2.5 hours).

Furthermore, when a pattern or an image is formed (for example, a printed wiring substrate is produced), a coating film formed on a base material may be subjected to pattern exposure. The pattern exposure may be performed either by scanning of laser light or by light irradiation through a photomask. By developing (or dissolving) a non-irradiated region (unexposed portion) generated by such pattern exposure with a developer, a pattern or an image can be formed.

As the developer, an alkaline aqueous solution or an organic solvent can be used.

Examples of the alkaline aqueous solution include: an aqueous solution of an alkali metal hydroxide such as potassium hydroxide, sodium hydroxide, potassium carbonate, and sodium carbonate; an aqueous solution of quaternary ammonium hydroxide such as tetramethylammonium hydroxide, tetraethylammonium hydroxide, and choline; and an amine aqueous solution such as ethanolamine, propylamine, and ethylenediamine.

The alkaline developer is generally an aqueous solution of 10% by mass or less, preferably an aqueous solution of 0.1 to 3.0% by mass. Furthermore, to the alkaline developer, alcohols or a surfactant may be added to be used and the blending amount of these additives is individually preferably 0.05 to 10 parts by mass, relative to 100 parts by mass of the alkaline developer. Among them, a 0.1 to 2.38% by mass tetramethylammonium hydroxide aqueous solution can be used.

As the organic solvent for the developer, a general organic solvent can be used. Examples of the organic solvent include acetone, acetonitrile, toluene, dimethylformamide, methanol, ethanol, isopropanol, propylene glycol methyl ether, propylene glycol ethyl ether, propylene glycol propyl ether, propylene glycol butyl ether, propylene glycol methyl ether acetate, propylene glycol ethyl ether acetate, propylene glycol propyl ether acetate, propylene glycol butyl ether acetate, ethyl lactate, and cyclohexanone. These organic solvents may be used individually or in combination of two or more of them. Particularly, propylene glycol methyl ether, propylene glycol methyl ether acetate, and ethyl lactate can be preferably used.

EXAMPLE

The epoxy compounds below were prepared.
[Preparation of Epoxy Compound]

Synthesis Example 1

Synthesis of bis(3,4-epoxybutyl)-4,5-epoxycyclohexane-1,2-dicarboxylic acid ester Into a reaction vessel equipped with a Dean-Stark apparatus and a cooler, 10 g of cis-4-cyclohexene-1,2-dicarboxylic anhydride, 0.6 g of p-toluenesulfonic acid monohydrate, 100 mL of toluene, and 10 g of 3-butene-1-ole were charged and the reaction was effected at a reflux temperature for 5 hours. After the completion of the reaction, the reaction mixture was washed with sodium bicarbonate water, was washed with water, was concentrated, and was purified by silica gel chromatography (using as a developing solvent, hexane/ethyl acetate in a volume ratio of hexane/ethyl acetate=80/20) to obtain 18 g of bis(3-butenyl)-4-cyclohexene-1,2-dicarboxylic acid ester as a colorless liquid.

Into a reaction vessel, 17 g of bis(3-butenyl)-4-cyclohexene-1,2-dicarboxylic acid ester and 300 mL of chloroform were charged and the resultant reaction mixture was cooled down to 0 to 10° C. To the reaction mixture, 51 g of methachloroperbenzoic acid was added and the temperature of the resultant reaction mixture was elevated to room temperature, followed by effecting the reaction for 18 hours. After the completion of the reaction, the reaction mixture was quenched with a sodium thiosulfate aqueous solution and to the resultant reaction mixture, sodium bicarbonate water was added, followed by extracting the resultant reaction mixture. The organic phase was washed with sodium bicarbonate water, was washed with water, and was dried and from the organic phase, the solvent was distilled off to obtain a crude product. The crude product was purified by silica gel chromatography (using as a developing solvent, hexane/ethyl acetate in a volume ratio of hexane/ethyl acetate=40/60 to 10/90) to obtain 16 g of a light yellow liquid.

The obtained compound was bis(3,4-epoxybutyl)-4,5-epoxycyclohexane-1,2-dicarboxylic acid ester corresponding to Formula (1-1). The epoxy compound was named (i-1).

Synthesis Example 2

Synthesis of bis(4,5-epoxypentyl)-4,5-epoxycyclohexane-1,2-dicarboxylic acid ester Into a reaction vessel equipped with a Dean-Stark apparatus and a cooler, 10 g of cis-4-cyclohexene-1,2-dicarboxylic anhydride, 0.6 g of p-toluenesulfonic acid monohydrate, 100 mL of toluene, and 12 g of 4-pentene-1-ole were charged and the reaction was effected at a reflux temperature for 6 hours. After the completion of the reaction, the reaction mixture was washed with sodium bicarbonate water, was washed with water, was concentrated, and was purified by silica gel chromatography (using as a developing solvent, hexane/ethyl acetate in a volume ratio of hexane/ethyl acetate=80/20) to obtain 19 g of bis(4-pentenyl)-4-cyclohexene-1,2-dicarboxylic acid ester as a colorless liquid.

Into a reaction vessel, 19 g of bis(4-pentenyl)-4-cyclohexene-1,2-dicarboxylic acid ester and 300 mL of chloroform were charged and the resultant reaction mixture was cooled down to 0 to 10° C. To the reaction mixture, 50 g of methachloroperbenzoic acid was added and the temperature of the resultant reaction mixture was elevated to room temperature, followed by effecting the reaction for 19 hours. After the completion of the reaction, the reaction mixture was quenched with a sodium thiosulfate aqueous solution and to the resultant reaction mixture, sodium bicarbonate water was added, followed by extracting the resultant reaction mixture. The organic phase was washed with sodium bicarbonate water, was washed with water, and was dried and from the organic phase, the solvent was distilled off to obtain a crude product. The crude product was purified by silica gel chromatography (using as a developing solvent, hexane/ethyl acetate in a volume ratio of hexane/ethyl acetate=40/60 to 10/90) to obtain 21 g of a colorless liquid.

The obtained compound was bis(4,5-epoxypentyl)-4,5-epoxycyclohexane-1,2-dicarboxylic acid ester corresponding to Formula (1-2). The epoxy compound was named (i-2).

Synthesis Example 3

Synthesis of bis(5,6-epoxyhexyl)-4,5-epoxycyclohexane-1,2-dicarboxylic acid ester Into a reaction vessel equipped with a Dean-Stark apparatus and a cooler, 10 g of cis-4-cyclohexene-1,2-dicarboxylic anhydride, 0.6 g of p-toluenesulfonic acid monohydrate, 100 mL of toluene, and 15 g of 5-hexene-1-ole were charged and the reaction was effected at a reflux temperature for 3 hours. After the completion of the reaction, the reaction mixture was washed with sodium bicarbonate water, was washed with water, was concentrated, and was purified by silica gel chromatography (using as a developing solvent, hexane/ethyl acetate in a volume ratio of hexane/ethyl acetate=90/10) to obtain 22 g of bis(5-hexenyl)-4-cyclohexene-1,2-dicarboxylic acid ester as a light yellow liquid.

Into a reaction vessel, 21 g of bis(5-hexenyl)-4-cyclohexene-1,2-dicarboxylic acid ester and 300 mL of chloroform were charged and the resultant reaction mixture was cooled down to 0 to 10° C. To the reaction mixture, 53 g of methachloroperbenzoic acid was added and the temperature of the resultant reaction mixture was elevated to room temperature, followed by effecting the reaction for 15 hours. After the completion of the reaction, the reaction mixture was quenched with a sodium thiosulfate aqueous solution and to the resultant reaction mixture, sodium bicarbonate water was added, followed by extracting the resultant reaction mixture. The organic phase was washed with sodium bicarbonate water, was washed with water, and was dried and from the organic phase, the solvent was distilled off to obtain a crude product. The crude product was purified by silica gel chromatography (using as a developing solvent, hexane/ethyl acetate in a volume ratio of hexane/ethyl acetate=40/60 to 10/90) to obtain 23 g of a light yellow liquid.

The obtained compound was bis(5,6-epoxyhexyl)-4,5-epoxycyclohexane-1,2-dicarboxylic acid ester corresponding to Formula (1-3). The epoxy compound was named (i-3).

Synthesis Example 4

Synthesis of bis(2,3-epoxypropyl)-4,5-epoxycyclohexane-1,2-dicarboxylic acid ester Into a reaction vessel, 15 g of cis-4-cyclohexene-1,2-dicarboxylic acid, 37 g of potassium carbonate, 255 mL of dimethylformamide, and 32 g of allyl bromide were charged and the reaction was effected at room temperature for 15 hours. After the completion of the reaction, the reaction mixture was filtered and to the filtrate, toluene and water were added, followed by extracting the filtrate. The organic phase was washed with water, was concentrated, and was purified by silica gel chromatography (using as a developing solvent, hexane/ethyl acetate in a volume ratio of hexane/ethyl acetate=90/10) to obtain 21 g of bis(2-propenyl)-4-cyclohexene-1,2-dicarboxylic acid ester as a light yellow liquid.

Into a reaction vessel, 21 g of bis(2-propenyl)-4-cyclohexene-1,2-dicarboxylic acid ester and 300 mL of chloroform were charged and the resultant reaction mixture was cooled down to 0 to 10° C. To the reaction mixture, 87 g of methachloroperbenzoic acid was added and the temperature of the resultant reaction mixture was elevated to room temperature, followed by effecting the reaction for 5 days. After the completion of the reaction, the reaction mixture was quenched with a sodium thiosulfate aqueous solution and to the resultant reaction mixture, sodium bicarbonate water was added, followed by extracting the resultant reaction mixture. The organic phase was washed with sodium bicarbonate water, was washed with water, and was dried and from the organic phase, the solvent was distilled off to obtain a crude product. The crude product was purified by silica gel chromatography (using as a developing solvent, hexane/ethyl acetate in a volume ratio of hexane/ethyl acetate=50/50 to 10/90) to obtain 20 g of a colorless liquid.

The obtained compound was bis(2,3-epoxypropyl)-4,5-epoxycyclohexane-1,2-dicarboxylic acid ester. The epoxy compound was named (i-4).

[Preparation of Photoacid Generator]

A propylene carbonate solution of a sulfonium salt (Formula (B-2), active ingredient 50%, trade name: CPI-101A, manufactured by San-Apro Ltd.) was prepared. This photoacid generator was named (ii-1).

[Photocurability Test of Curable Composition]

An epoxy compound and an acid generator were blended and mixed at 40° C. and the resultant mixture was degassed to prepare a curable composition. In Table 1, all of the blending amounts are expressed in a unit of part by mass and the blending amount of the epoxy compound and the acid generator is expressed in a unit of part by mass of an active ingredient. The photoacid generator (ii-1) of propylene carbonate solution was used as it was.

The prepared curable composition was irradiated with UV (ultraviolet ray) from a position distant by 9.5 cm from the curable composition and the photocuring behavior of the curable composition was observed by a rheometer (viscometer) to define the time (second) until the storage modulus has reached $1 \times 10^4$ Pa as the curing time (second). The UV irradiation was performed until 600 seconds.

As the rheometer, a rheometer (manufactured by Reologica Instruments Ab. (trade name: VAR-50 type)) was used and as the lamp, an Hg—Xe lamp was used. In the UV irradiation, the wavelength of the irradiated UV was 365 nm and the irradiation dose was 20 mW/cm². In the UV irradiation, as the material of the irradiation window, a hard glass of 3 mm thickness was used and the film thickness of the coating film formed from the curable composition was 50 μm. The photocuring rate of the curable composition was measured.

TABLE 1

| Component | Example 1 | Example 2 | Example 3 | Comparative Example 1 |
|---|---|---|---|---|
| (i-1) | 100 | | | |
| (i-2) | | 100 | | |
| (i-3) | | | 100 | |
| (i-4) | | | | 100 |
| (ii-1) | 2 | 2 | 2 | 2 |
| Curing time (second) | 380 | 65 | 55 | 560 |

INDUSTRIAL APPLICABILITY

The present invention provides a curable composition having a low viscosity and high cationic curability. A cured product formed from the curable composition has characteristics such as high toughness, a low viscosity, and fast curing and can be used for the coating or adhering of electronic parts, optical parts, or precision machine parts. The curable composition of the present invention can be used for the adhering of, for example: an optical element such as a lens of a cellular phone or a camera, a light-emitting diode (LED), and a semiconductor laser (LD); parts such as a liquid crystal panel, a biochip, and a lens or a prism of a camera; magnetic parts of a hard disc of a personal computer or the like; a pickup (a part capturing optical information reflected from a disc) of a CD or DVD player; a cone and a coil of a speaker; a magnet of a motor; a circuit substrate; electronic parts; and parts inside an engine of an automobile and the like.

The curable composition of the present invention is applicable to, for example, a body of an automobile or a motorcycle, a lens or a mirror of a head light, a plastic lens of glasses, a cellular phone, a game machine, an optical film, and an ID card as an application to a hard coating material for surface protection of an automobile body, a lamp or electric appliances, a building material, a plastic, and the like.

Furthermore, examples of the application of the curable composition of the present invention include application to cards such as a credit card and a membership certificate, application to a printing ink for a switch and a key board of electric appliances and OA equipment, and application to an ink for an inkjet printer for CD, DVD, and the like as an application to an ink material for printing on a metal such as aluminum and a plastic.

Then, examples of the application of the curable composition of the present invention include also application to a technology for producing a complicated three-dimensional object in combination with a three-dimensional CAD by curing a resin, application to a photo fabrication such as modeling of industrial products, and applications to coating of an optical fiber, adhering, optical waveguide, and thick film resist (for MEMS).

The invention claimed is:

1. A curable composition comprising:
an epoxy compound of Formula (1):

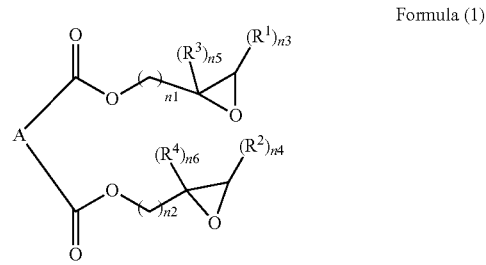

Formula (1)

[in Formula (1), A is a monocyclic aliphatic hydrocarbon group optionally containing an epoxy group; $R^1$, $R^2$, $R^3$ and $R^4$ are independently a hydrogen atom or a $C_{1-10}$ alkyl group; n1 and n2 are independently an integer of 2 to 6; n3 and n4 are individually an integer of 2; and n5 and n6 are individually an integer of 1]; and an acid generator.

2. The curable composition according to claim 1, wherein A in Formula (1) is a cyclohexyl group containing an epoxy group.

3. The curable composition according to claim 1, wherein n1 and n2 in Formula (1) are individually 2, and $R^1$, $R^2$, $R^3$ and $R^4$ are individually a hydrogen atom.

4. The curable composition according to claim 1, wherein n1 and n2 in Formula (1) are individually 3, and $R^1$, $R^2$, $R^3$ and $R^4$ are individually a hydrogen atom.

5. The curable composition according to claim 1, wherein n1 and n2 in Formula (1) are individually 4, and $R^1$, $R^2$, $R^3$ and $R^4$ are individually a hydrogen atom.

6. The curable composition according to claim 1, wherein the acid generator is a photoacid generator or a thermal acid generator.

7. The curable composition according to claim 1, wherein the acid generator is an onium salt.

8. The curable composition according to claim 1, wherein the acid generator is a sulfonium salt compound or an iodonium salt compound.

9. The curable composition according to claim 1, wherein the curable composition contains the acid generator in a ratio of 0.1 to 20% by mass, based on the mass of the epoxy compound.

* * * * *